United States Patent
Liu et al.

(10) Patent No.: US 10,022,951 B2
(45) Date of Patent: Jul. 17, 2018

(54) SYSTEMS AND METHODS FOR IMPLEMENTING A VAPOR CONDENSATION TECHNIQUE FOR DELIVERING A UNIFORM LAYER OF DAMPENING SOLUTION IN AN IMAGE FORMING DEVICE USING A VARIABLE DATA DIGITAL LITHOGRAPHIC PRINTING PROCESS

(71) Applicant: XEROX Corporation, Norwalk, CT (US)

(72) Inventors: Chu-heng Liu, Penfield, NY (US); Santokh Badesha, Pittsford, NY (US)

(73) Assignee: Xerox Corporation, Norwalk, CT (US)

( * ) Notice: Subject to any disclaimer, the term of this patent is extended or adjusted under 35 U.S.C. 154(b) by 283 days.

(21) Appl. No.: 14/264,018

(22) Filed: Apr. 28, 2014

(65) Prior Publication Data
US 2015/0309413 A1 Oct. 29, 2015

(51) Int. Cl.
*B41F 7/24* (2006.01)
*G03F 7/16* (2006.01)
*G03F 7/18* (2006.01)

(52) U.S. Cl.
CPC ............. *B41F 7/24* (2013.01); *G03F 7/16* (2013.01); *G03F 7/18* (2013.01)

(58) Field of Classification Search
CPC . B41F 7/24; G03F 7/2041; G03F 7/16; G03F 7/18
See application file for complete search history.

(56) References Cited

U.S. PATENT DOCUMENTS

| | | | |
|---|---|---|---|
| 3,067,056 A * | 12/1962 | Remer | B41F 9/066 101/153 |
| 3,800,699 A | 4/1974 | Carley | |
| 4,485,737 A * | 12/1984 | Jeschke | B41F 33/0054 101/148 |
| 7,191,705 B2 | 3/2007 | Berg et al. | |
| 2004/0003737 A1* | 1/2004 | Suda | B41C 1/1041 101/463.1 |
| 2004/0023105 A1* | 2/2004 | Hohenthanner | B01J 37/0215 429/480 |
| 2004/0197251 A1* | 10/2004 | Williamson | B01D 53/56 423/235 |
| 2011/0290128 A1* | 12/2011 | Hansson | B41F 7/30 101/147 |
| 2013/0033687 A1* | 2/2013 | Stowe | B41F 7/30 355/30 |
| 2013/0247788 A1 | 9/2013 | Liu et al. | |

* cited by examiner

*Primary Examiner* — Alison L Hindenlang
*Assistant Examiner* — Michael Robinson
(74) *Attorney, Agent, or Firm* — Caesar Rivise, PC

(57) ABSTRACT

A system and method are provided for depositing a uniform layer of a dampening solution using a vapor deposition/condensation process or technique on a reimageable surface in an image forming device using a proposed variable data digital lithographic image forming architecture that transfers ink at an efficiency rate in excess of 95 percent. A reimageable surface is configured of a low surface energy surface component that directly accepts a vaporized dampening solution having a lower surface energy than the surface energy of the reimageable surface. A uniformity in the layer of condensed dampening solution on the reimageable surface is a product of the relative difference in the low surface energy of the reimageable surface and the lower surface energy of the dampening solution.

8 Claims, 3 Drawing Sheets

SYSTEMS AND METHODS FOR IMPLEMENTING A VAPOR CONDENSATION TECHNIQUE FOR DELIVERING A UNIFORM LAYER OF DAMPENING SOLUTION IN AN IMAGE FORMING DEVICE USING A VARIABLE DATA DIGITAL LITHOGRAPHIC PRINTING PROCESS

BACKGROUND

1. Field of Disclosed Subject Matter

This disclosure relates to systems and methods for providing an optimized material set for forming a uniform layer of dampening solution on a reimageable surface using a vapor deposition process in an image forming device using a proposed variable data digital lithographic image forming architecture.

2. Related Art

U.S. Patent Application Publication No. 2012/0103212 A1 (the 212 Publication) published May 3, 2012 and based on U.S. patent application Ser. No. 13/095,714, which is commonly assigned and the disclosure of which is incorporated by reference herein in its entirety, proposes systems and methods for providing variable data lithographic and offset lithographic printing or image receiving medium marking in image forming system. The systems and methods disclosed in the 212 Publication are directed to improvements on various aspects of previously-attempted variable data imaging lithographic marking concepts to achieve effective truly variable digital data lithographic printing.

According to the 212 Publication, a reimageable surface is provided on an imaging member, which may be a drum, plate, belt or the like. The reimageable surface may be composed of, for example, a class of materials commonly referred to as silicones, including polydimethylsiloxane (PDMS) among others. The reimageable surface may be formed of a relatively thin layer over a mounting layer, a thickness of the relatively thin layer being selected to balance printing or marking performance, durability and manufacturability.

The 212 Publication describes, in requisite detail, an exemplary variable data lithography system 100 such as that shown, for example, in FIG. 1. A general description of the exemplary system 100 shown in FIG. 1 is provided here. Additional details regarding individual components and/or subsystems shown in the exemplary system 100 of FIG. 1 may be found in the 212 Publication.

As shown in FIG. 1, the exemplary system 100 may include an imaging member 110. The imaging member 110 in the embodiment shown in FIG. 1 is a drum, but this exemplary depiction should not be read in a manner that precludes the imaging member 110 being a plate or a belt, or of another known configuration. The imaging member 110 is used to apply an inked image to an image receiving media substrate 114 at a transfer nip 112. The transfer nip 112 is produced by an impression roller 118, as part of an image transfer mechanism 160, exerting pressure in the direction of the imaging member 110. The exemplary system 100 may be used for producing images on a wide variety of image receiving media substrates 114. The 212 Publication also explains the wide latitude of marking (printing) materials that may be used, including marking materials with pigment densities greater than 10% by weight. As does the 212 Publication, this disclosure will use the term ink to refer to a broad range of printing or marking materials to include those which are commonly understood to be inks, pigments, and other materials which may be applied by the exemplary system 100 to produce an output image on the image receiving media substrate 114.

The 212 Publication depicts and describes details of the imaging member 110 including the imaging member 110 being comprised of a reimageable surface layer formed over a structural mounting layer that may be, for example, a cylindrical core, or one or more structural layers over a cylindrical core.

The exemplary system 100 includes a dampening solution subsystem 120. In the embodiment depicted and described in the 212 Publication, and as shown in FIG. 1, the dampening solution subsystem 120 generally comprises a series of rollers. These rollers may be considered as dampening rollers or a dampening unit for uniformly wetting the reimageable surface of the imaging member 110 with a dampening solution. A purpose of the dampening solution subsystem 120 is to deliver a layer of dampening solution, generally having a uniform and controlled thickness, to the reimageable surface of the imaging member 110. As described in the 212 Publication, the dampening solution may comprise mainly water optionally with small amounts of isopropyl alcohol (IPA) or ethanol added to reduce surface tension as well as to lower evaporation energy necessary to support subsequent laser patterning, as will be described in greater detail below. Small amounts of certain surfactants may be added to the dampening solution as well to adjust the inking and transfer properties of the reimageable surface of the imaging member 110. Experiments continue to determine an optimal release layer solution. As will also be described in greater detail below, additional experiments have continued to optimize other aspects of the proposed system depicted and described in the 212 Publication.

Once the dampening solution is metered onto the reimageable surface of the imaging member 110, a thickness of the dampening solution may be measured using a sensor 125 that may provide feedback to control the metering of the dampening solution onto the reimageable surface of the imaging member 110 by the dampening solution subsystem 120.

Once a precise and uniform amount of dampening solution is provided by the dampening solution subsystem 120 on the reimageable surface of the imaging member 110, and optical patterning subsystem 130 may be used to selectively form a latent image in the uniform dampening solution layer by image-wise patterning the dampening solution layer using, for example, laser energy. The reimageable surface of the imaging member 110 should ideally absorb most of the laser energy emitted from the optical patterning subsystem 130 close to the surface to minimize energy wasted in heating the dampening solution and to minimize lateral spreading of heat in order to maintain a high spatial resolution capability. Alternatively, an appropriate radiation sensitive component may be added to the dampening solution to aid in the absorption of the incident radiant laser energy. While the optical patterning subsystem 130 is described above as being a laser emitter, it should be understood that a variety of different systems may be used to deliver the optical energy to pattern the dampening solution.

The mechanics at work in the patterning process undertaken by the optical patterning subsystem 130 of the exemplary system 100 are described in detail with reference to FIG. 5 in the 212 Publication. Briefly, the application of optical patterning energy from the optical patterning subsystem 130 results in selective evaporation of portions of the layer of fountain solution.

Following patterning of the dampening solution layer by the optical patterning subsystem 130, the patterned layer over the reimageable surface of the imaging member 110 is presented to an inker subsystem 140. The inker subsystem 140 is used to apply a uniform layer of ink over the layer of dampening solution and the reimageable surface layer of the imaging member 110. The inker subsystem 140 may use an anilox roller to meter an ink onto one or more ink forming rollers that are in contact with the reimageable surface layer of the imaging member 110. Separately, the inker subsystem 140 may include other traditional elements such as a series of metering rollers to provide a precise feed rate of ink to the reimageable surface. The inker subsystem 140 may deposit the ink to the pockets representing the imaged portions of the reimageable surface, while ink deposited on the unformatted portions of the dampening solution will not adhere based on the hydrophobic and/or oleophobic nature of those portions.

A cohesiveness and viscosity of the ink residing in the reimageable layer of the imaging member 110 may be modified by a number of mechanisms. One such mechanism may involve the use of a rheology (complex viscoelastic modulus) control subsystem 150. The rheology control system 150 may form a partial crosslinking core of the ink on the reimageable surface to, for example, increase ink cohesive strength relative to the reimageable surface layer. Curing mechanisms may include optical or photo curing, heat curing, drying, or various forms of chemical curing. Cooling may be used to modify rheology as well via multiple physical cooling mechanisms, as well as via chemical cooling.

The ink is then transferred from the reimageable surface of the imaging member 110 to a substrate of image receiving medium 114 using a transfer subsystem 160. The transfer occurs as the substrate 114 is passed through a transfer nip 112 between the imaging member 110 and an impression roller 118 such that the ink within the voids of the reimageable surface of the imaging member 110 is brought into physical contact with the substrate 114. With the adhesion of the ink having been modified by the rheology control system 150, modified adhesion of the ink causes the ink to adhere to the substrate 114 and to separate from the reimageable surface of the imaging member 110. Careful control of the temperature and pressure conditions at the transfer nip 112, among all of the other carefully controlled conditions and parameters in this process, are intended to support transfer efficiencies for the ink from the reimageable surface of the imaging member 110 to the substrate 114 to exceed 70%, and preferably exceed 90% to 95% to, for example, reduce or minimize necessary cleaning of the inked surface. While it is possible that some dampening solution may also wet substrate 114, the volume of such a dampening solution will be minimal, and will rapidly evaporate or be absorbed by the substrate 114.

In certain offset lithographic systems, it should be recognized that an offset roller, not shown in FIG. 1, may first receive the ink image pattern and then transfer the ink image pattern to a substrate according to a known indirect transfer method using an offset roller or other device as an intermediate transfer body.

Following the transfer of the majority of the ink to the substrate 114 at the transfer nip 112, any preferably limited amount of residual ink and/or any residual dampening solution must be removed from the reimageable surface of the imaging member 110 to prepare the reimageable surface to repeat the digital image forming operation without "ghosting." This removal is most preferably undertaken without scraping or wearing the reimageable surface of the imaging member 110. An air knife or other like non-contact device may be employed to remove residual products. It is anticipated, however, that some amount of ink residue may remain. Removal of such remaining ink residue may be accomplished through use of some form of active cleaning subsystem 170. The 212 Publication describes details of such a cleaning subsystem 170 including at least a first cleaning member such as a sticky or tacky member in physical contact with the reimageable surface of the imaging member 110, the sticky or tacky member removing residual ink and any remaining small amounts of surfactant compounds from the dampening solution of the reimageable surface of the imaging member 110. The sticky or tacky member may then be brought into contact with a smooth roller to which residual ink may be transferred from the sticky or tacky member, the ink being subsequently stripped from the smooth roller by, for example, a doctor blade or other like device and collected as waste.

The 212 Publication details other mechanisms by which cleaning of the reimageable surface of the imaging member 110 may be facilitated. Regardless of the cleaning mechanism, however, cleaning of the residual ink and dampening solution from the reimageable surface of the imaging member 110 is essential to preventing ghosting in subsequent image forming operations as the images change. Once cleaned, the reimageable surface of the imaging member 110 is again presented to the dampening solution subsystem 120 by which a fresh layer of dampening solution is supplied to the reimageable surface of the imaging member 110, and the process is repeated.

SUMMARY OF DISCLOSED EMBODIMENTS

According to the above proposed structure, variable data digital lithography systems have attracted attention in producing truly variable digital images in a lithographic image forming system. The above-described architecture combines the functions of the imaging plate and potentially a transfer blanket into a single imaging member 110.

Experimentation continues in efforts to improve and optimize several of the individual components or subsystems in the proposed variable data digital lithography system, including such aspects as a composition of the reimageable surface, a composition of the inks, a composition of the dampening solution, a configuration of the dampening solution subsystem, and compositions and configurations of other component elements. Of particular interest is an optimal cooperation of the composition of the reimageable surface, the compositions of the inks and an optimal selection of a dampening solution to promote highest efficiency and high quality ink transfer from the reimageable surface to a broad array of image receiving media substrates.

Since the filing of the application that published as the 212 Publication, alternative configurations for at least the dampening solution subsystem, and mechanisms by which to more effectively deposit the required uniform layer of dampening solution have been explored.

It has been determined that roller-based deposition of dampening solution may have certain drawbacks. Mechanical integrity of the dampening solution roller, mechanical alignment of the dampening solution roller with the reimageable surface, surface integrity of a surface material of the dampening solution roller and other mechanical and interactive effects between the dampening solution roller surface and the reimageable surface of the imaging member may adversely affect uniformity in the deposited layer of dampening solution, which may, in turn, translate into image quality defects. Additionally, effective cleaning of contaminants from the roller can further frustrate image quality.

In view of these difficulties, myriad potential dampening solution application techniques have been investigated including jetting and other spray technologies. Experiments using these techniques have met with limited success in achieving the required uniformity. In general, it has been determined that these techniques require the addition of forming rollers to smooth the jetted or sprayed layer to achieve the required uniformity, thereby reintroducing many of the difficulties encountered with roller-only deposition systems.

Some success in addressing the above difficulties has been realized through experimentation involving the use of vapor condensation techniques. Through experimentation, it has been determined that vapor condensation may have emerged as the mainline approach for applying dampening solution in the proposed variable data digital lithographic image forming systems and processes. Image quality has been found to be far superior compared to other application methods such as rollers. In short, no suitable alternatives have been identified.

Vapor condensation deposition has its own challenges in that, in unrestricted vapor condensation scenarios, the vapor generally may condense on a surface as a fog that tends to bead up on the surface and itself then needs to be uniformly spread. In general, if the liquid material has a higher surface energy than the substrate surface, the liquid material will not spread out evenly on the surface of the substrate, but rather the liquid material will bead up.

This is the challenge that is addressed in U.S. Pat. No. 7,191,705 to Berg et al., issued Mar. 20, 2007 (the 705 patent). The solution that was attempted in the 705 patent was to apply a separate surfactant as a hydrophilic layer having a high surface energy coating on the substrate surface before application of the vapor deposition of the dampening solution on the substrate surface. So an extra step, with additional complicated mechanical implementation, was required to pretreat the substrate surface with an anti-fogging material prior to the vapor deposition of the dampening solution. The anti-fogging materials were surfactants or hydrophilic materials that, once spread on the substrate surface, allowed the water-based dampening solution to condense on the substrate surface, with the surfactant allowing the water to spread on the surface instead of beading up. This process, with the requisite complicating steps, was found to promote the deposition of a uniform film of water, or water-based dampening solution, that was not foggy. Unfortunately, this solution would not work in the proposed variable data digital lithographic image forming process as the high surface energy surfactant would adversely affect ink transfer efficiencies, i.e., more ink would remain attracted to the reimageable surface.

In view of the above issues, it would be advantageous to adapt a vapor condensation system for deposition of uniform layers of particular dampening solutions or fluids that will still promote more than 70%, and preferably more than 90% to 95%, transfer of ink from a reimageable surface, to which the particular dampening solutions and fluids are applied, to an image receiving medium.

Exemplary embodiments of the disclosed systems and methods may provide a unique combination of material sets to achieve satisfactory vapor condensation and uniform layer spreading to promote high efficiency transfer of ink in the proposed variable data digital lithographic image forming process. Of note, none of the conventional, or previously attempted, techniques are concerned with, or are directed to, supporting high efficiency release of material (ink), i.e., much in excess of 50%, from the reimageable surface.

Exemplary embodiments may be centered around a reimageable surface layer that is formed of a low surface energy material. Next, in order to obtain a uniform overlayer of dampening solution or fluid, the material in the overlayer, i.e., the dampening solution or fluid, must be of an even lower surface energy.

Exemplary embodiments may be unique in view of the prior art in that the disclosed systems and methods carefully materially match the material of which the reimageable surface of the imaging member is formed, which itself promotes high transfer efficiency, with a material for the dampening solution or fluid to promote layer formation and also to support high transfer efficiency of the ink from the reimageable surface. A uniqueness of the disclosed embodiments resides in the need to have a low surface energy reimageable surface, and an even lower surface energy dampening solution or fluid vapor deposited thereon.

These and other features, and advantages, of the disclosed systems and methods are described in, or apparent from, the following detailed description of various exemplary embodiments.

BRIEF DESCRIPTION OF THE DRAWINGS

Various exemplary embodiments of the disclosed systems and methods for providing an optimized material set for forming a uniform layer of dampening solution or fluid on a reimageable surface using a vapor deposition process in an image forming device using a proposed variable data digital lithographic image forming architecture will be described, in detail, with reference to the following drawings, in which.

DETAILED DESCRIPTION OF THE DISCLOSED EMBODIMENTS

Figure 1:
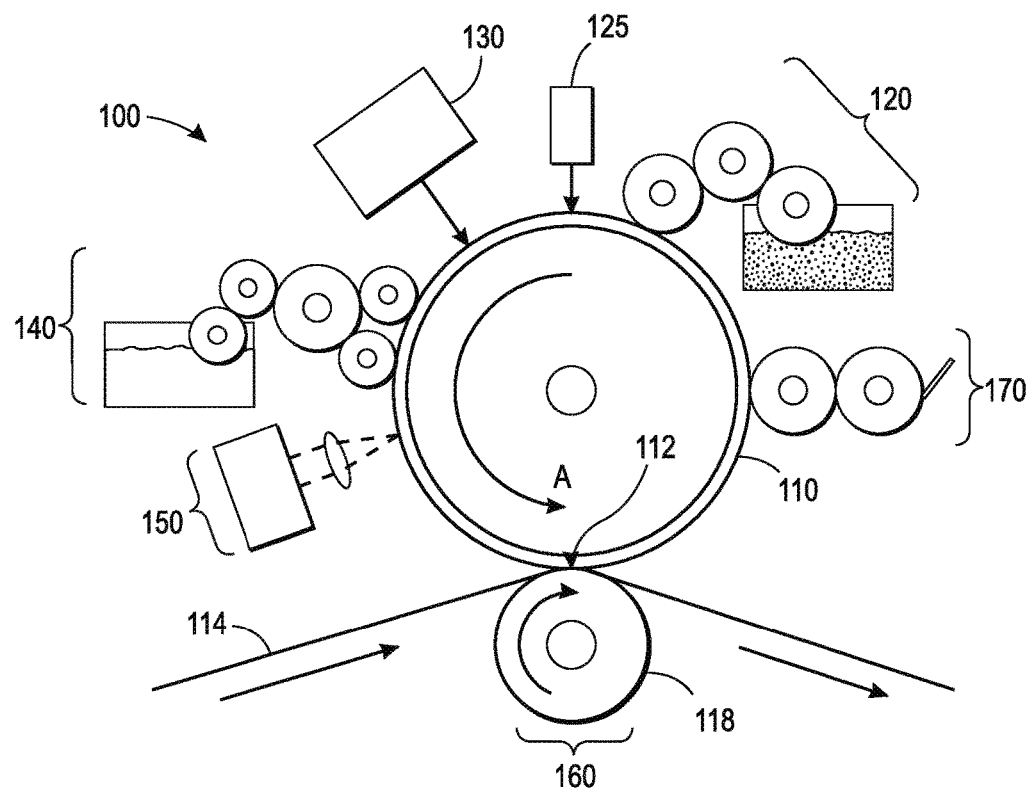
FIG. 1 illustrates a schematic representation of a proposed variable data digital lithographic image forming system.

The systems and methods for providing an optimized material set for forming a uniform layer of dampening solution on a reimageable surface using a vapor deposition process in an image forming device using a proposed variable data digital lithographic image forming architecture according to this disclosure will generally refer to this specific utility or function for those systems and methods. Exemplary embodiments described and depicted in this disclosure should not be interpreted as being specifically limited to any particular configuration of the described dampening solution vapor deposition unit. Any advantageous adaptation of a digital image forming process that may benefit from implementation of a unique dampening solution deposition scheme or technique generally in the manner described is contemplated as being included in this disclosure.

Specific reference to, for example, lithographic printing techniques, and to the proposed variable data digital lithographic image forming device should not be considered as being limited to any particular configuration of the techniques or devices, as described. Any terms used to describe an "image forming device," an "offset lithographic printing device/system," an "offset lithographic marking device/system" and the like, as referenced throughout this disclosure are intended to refer globally to a class of devices and systems that carry out what are generally understood as lithographic marking functions as those functions would be familiar to those of skill in the art. Additionally, while references will generally be made to individual deposition unit components, these references are intended to be exemplary only and not limiting to the disclosed subject matter.

This disclosure is directed to exemplary embodiments of an enhanced vapor deposition system for a proposed variable data digital lithographic image forming architecture with optimized dampening solution and reimageable surface physical properties. The proposed variable data digital lithographic image forming architecture, as described generally above, may be modified to include a specific material set for the reimageable surface and the dampening solution to provide the desired physical properties to overcome the shortcomings of previous attempts at implementing vapor deposition methods, such as those associated with the traditional lithographic materials. Compared to conventional lithographic image forming, or any alleged prior art attempts at variable data lithographic image forming, the proposed variable data digital lithographic image forming architecture is unique in its requirement that, to be effective, it enables high efficiency transfer of ink from the reimageable substrate during image forming operations. In this regard, a low surface energy reimageable surface (or transfer blanket) may be used to enable high efficiency ink transfer. Due to wetting requirements, i.e, that the dampening solution completely wets the reimageable surface, a dampening solution or fluid with an even lower surface energy, such as D4, may preferably be selected as the dampening solution or fluid. In embodiments, certain control of the boiling point of the dampening solution or fluid may be undertaken to be in a range of between 100~300 C for evaporation latitude. With the correct material set, vapor condensation of a very low surface energy dampening solution or fluid onto a low surface energy reimageable surface may be implemented with excellent performance in producing highest quality images.

Certain operational challenges addressed by the disclosed embodiments, specifically in implementing a usable and effective vapor condensation system in a proposed variable data digital lithographic image forming architecture include the following. The vaporized dampening solution or fluid should spread uniformly on the reimageable surface after condensation without beading. As indicated in some detail above, this generally requires that the dampening solution or fluid has lower surface energy than the reimageable surface. This presents a fair challenge in that conventional dampening (or fountain) solutions have been preferably water based. In general, the preferred low surface energy dampening solution or fluid cannot be comprised of any non-vaporizable ingredients that may be usable to advantageously lower the surface energy of a base fluid such as water. This "requirement" generally restricts the use of many surfactants in the dampening solution or fluid. Because of the limitations on the fluid surface tension for conventional water-based dampening solutions with no surfactants, only high surface energy plates could effectively accommodate such dampening solutions. These were effective for low efficiency ink transfer systems such as those to which, for example, conventional systems like those described in U.S. Pat. No. 3,800,699 may have been directed. Only low transfer efficiency was achieved in those systems through ~50/50 ink image splitting. Transfer efficiencies such as those required by the proposed variable data digital lithographic image forming architecture would have been unachievable in those systems based on the high surface energy of the imaging surface, such as a plate.

The disclosed schemes may select from a limited range of cooperating materials for the reimageable surface and for the dampening solution or fluid to maintain 70%, and preferably 90+%, efficiency release component for the ink. The latitude in the range of materials to obtain this objective is extremely limited to a very small class of materials that can release ink well, and in the required efficiencies for the proposed variable data digital lithographic image forming system to operate effectively. These materials include low surface energy materials such as, for example, Teflon®, silicone and fluorosilicone, which must be functionally matched to achieve the disclosed objectives and functions.

The focus of the proposed variable data digital lithographic image forming process is to obtain in excess of 70% and preferably 90% to 95% ink release efficiency. In order to obtain this objective, the reimageable surface must be formed of a low surface energy material, particularly having a surface energy in a range of less than 30, and preferably in a range of 20-24 to enable high transfer efficiency. Reimageable surface materials may include silicone, fluorosilicone, hydrofluoroelastomers, and hybrids and blends of silicone and hydrofluoroelastomers. An infra-red absorbing particulate additive to promote more efficient dampening solution evaporation may be added, including regular and functionalized carbon blacks, iron oxide and carbon nanotubes in an amounts that may vary from 2-30%.

Then, a vapor condensation process may be implemented to dispose a uniform (non-beading) layer of dampening solution or fluid of an even lower surface energy on the reimageable surface. Low surface energy dampening solutions or fluids require that the surface energies of the dampening solutions or fluids be less than the surface energies of the reimageable surfaces, preferably in a range of 25 or less and more preferably at 22 or less, and where achievable, at 20 or less. Dampening solution or fluid boiling point may be selected to be in a range of ~100 C-300 C. If the boiling point is too high, it is difficult to generate the vapor. If the boiling point is too low, the condensation process may be challenged. In addition, the condensed fluid may be easily disturbed by air flow. Experiments have further determined that a single component fluid is preferable. As noted above, dampening fluid candidates include linear and cyclic polydimethyl siloxanes, e.g., D3, D4, D5, OS10, OS 20, OS30 or their mixtures and Novec series. Dampening fluid condensation thickness may preferably be in a range of 0.05 um~1.0 um, and is more preferably in a range 0.05 um~0.2 um.

In experimentation, water-based material dampening solutions were exhaustively tried, and generally discarded. Use of water-based solutions required addition of certain surfactants, which turned out to be a difficult proposition for vapor deposition. While such solutions worked well in roller application scenarios, for implementing condensing dampening solutions on the reimageable surface, the size of the surfactant molecules adversely affected the ability to apply water/surfactant solutions in a vapor deposition process. It was determined that the water could be reduced to a molecular form and then condense on the reimageable surface, but the same physical properties could not be obtained with the surfactant.

It must be noted that, although low surface energy rollers, e.g., Teflon® surfaced rollers, in image forming processes and/or devices may be known for carrying out certain functions, there were, in the prior art, drawbacks to their use for blanket rollers or imaging surfaces, particularly with dampening solution applications. These rollers are not used to attract ink, because they are not good at attracting and holding the ink layer stably in order to produce an inked image. It is only through the detailed experimentation undertaken in the development of the disclosed subject matter, and in contrast to conventional wisdom, that an appropriate balance is struck in the disclosed embodiments between effective retention of ink on the reimageable surface and highly effective transfer of that ink to an array of substrate materials.

Moreover, D4 was never used in lithographic printing. D4 has emerged, through experimentation, as the preferable dampening solution for the proposed variable data digital lithographic image forming process. Nowhere in the industry is D4 conventionally used, nor is low surface energy dampening fluid used, especially with a vapor deposition or condensation method for depositing the dampening solution on the reimageable surface.

Figure 2:
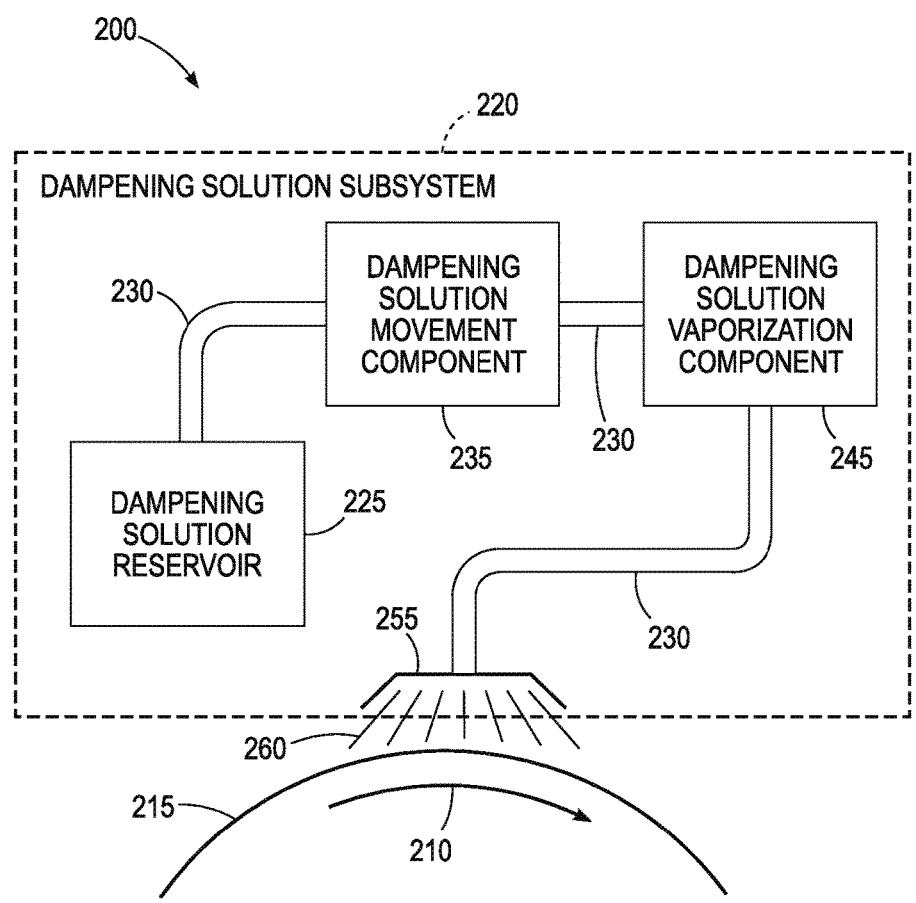
FIG. 2 illustrates a schematic representation of an exemplary embodiment of an improved dampening solution subsystem for use in a variable data digital lithographic image forming system according to this disclosure.

FIG. 2 illustrates a schematic representation of an exemplary embodiment of an improved dampening solution subsystem 200 for use in a variable data digital lithographic image forming system according to this disclosure. Comparing the orientations of the depiction of the exemplary deposition solution subsystem in FIG. 2 and the depiction of the dampening solution subsystem 120 in FIG. 1 will inform those of skill in the art that no particular orientation of the particular deposition elements should be implied from these depictions.

The exemplary dampening solution subsystem 200 may be provided to deposit a uniform layer of dampening solution 260 in a vapor condensation process on a reimageable surface 215 of an imaging member 210. A dampening solution subsystem 220 may include a dampening solution reservoir 225 that contains an appropriate dampening solution or fluid in a liquid state. Internal piping 230 may be provided to support circulation of the dampening solution or fluid from the dampening solution reservoir through the exemplary dampening solution subsystem 200 under the control of at least one dampening solution movement component 235, which may be a pump. A dampening solution vaporization component 245 may be provided to convert the dampening solution or fluid into a vapor. The dampening solution vaporization component 245 may effect the vaporization of the dampening solution or fluid by any of a number of different techniques, such as, for example, heating the liquid state fluid to a boil by a heating element that may be one or more resistive heating coils, a radiation source (e.g., a microwave), an optical source (e.g., a laser), a conductive source (e.g., a heated fluid carried by conduit), or other like heating method.

The dampening solution or fluid in a vapor state may be transported to a dampening solution vapor delivery component 255 located facing the reimageable surface 215. The dampening solution vapor delivery component 255 may be in a form of a flow control structure or manifold disposed proximately to the reimageable surface 215 to form, for example, a condensation region therebetween. When in the form of a manifold, the dampening solution vapor delivery component 255 may be configured with a plurality of openings, e.g., slots or nozzles, that may be disposed on a face of the dampening solution vapor delivery component 255 such that a pressurized gas may be ejected therefrom in the direction of reimageable surface 215.

The dampening solution exiting the dampening solution vapor delivery component 255 may be particularly metered to settle from a vapor state into a liquid state on the reimageable surface 215 to form a uniform layer of the dampening solution at a controlled thickness. In embodiments, effective vapor condensation may be obtained by providing the dampening solution vapor to the condensation zone at an increased vapor pressure over the saturated vapor pressure at the temperature of reimageable surface 215. This may be achieved by generating the dampening solution vapor at an elevated temperature through movement and heating of the dampening solution in the exemplary dampening solution subsystem 200. With the correct selection for the material properties of the reimageable surface 215 and the dampening solution according to the disclosed embodiments, no additional control of temperatures, for example, of the reimageable surface 215 may be necessary to facilitate the condensation process on the reimageable surface 215 as was undertaken in certain prior art systems.

Figure 3:
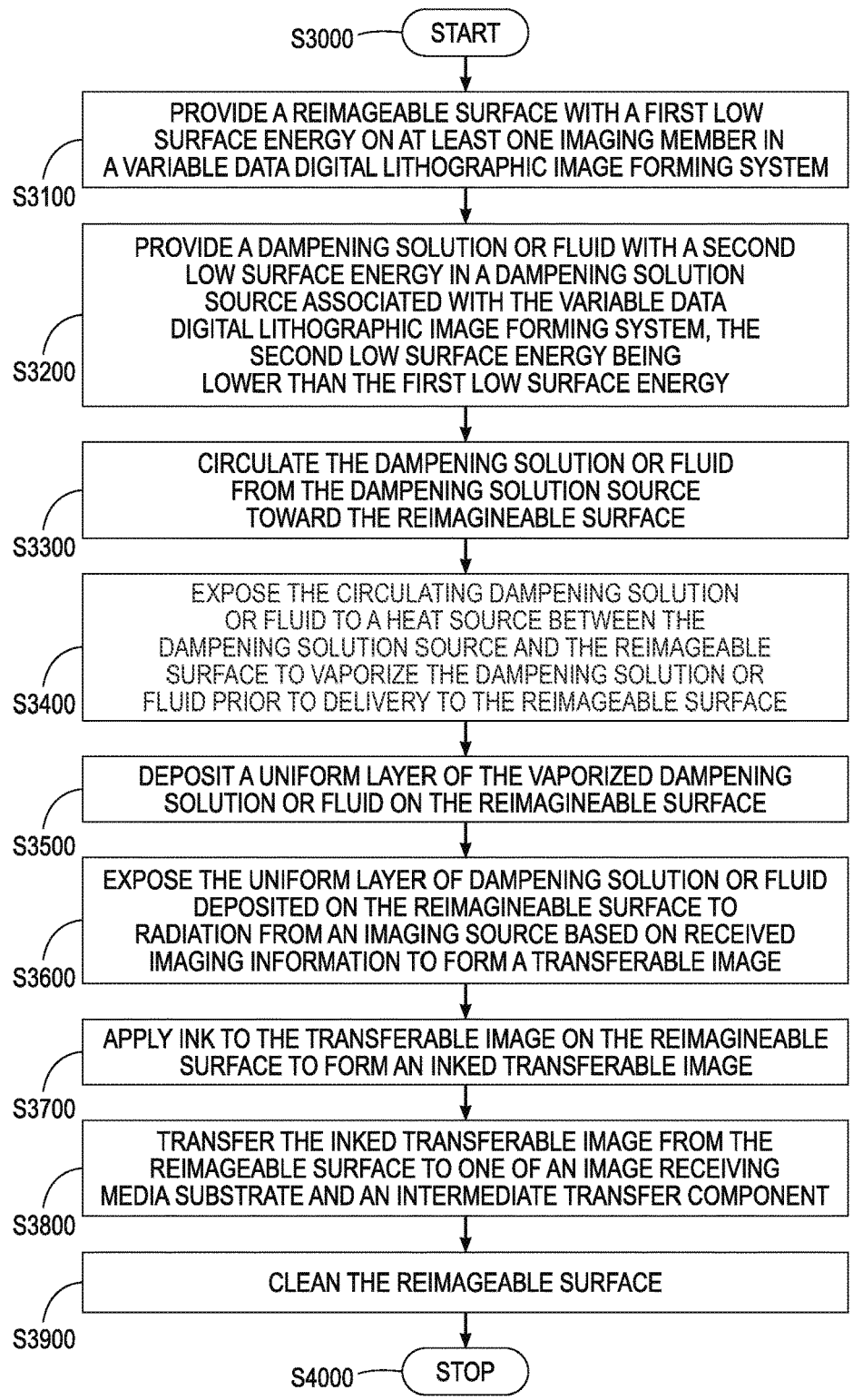
FIG. 3 illustrates a flowchart of an exemplary dampening fluid deposition process for reimageable surface coating in a proposed variable data digital lithographic image forming system according to this disclosure.

The disclosed embodiments may include an exemplary dampening fluid deposition process for reimageable surface coating in a proposed variable data digital lithographic image forming system. FIG. 3 illustrates a flowchart of such an exemplary method. As shown in FIG. 3, operation of the method commences at Step S3000 and proceeds to Step S3100.

In Step S3100, a reimageable surface may be provided on at least one imaging member in a variable data digital lithographic image forming system, the reimageable surface having a low surface energy, e.g., less than 30. Operation of the method proceeds to Step S3200.

In Step S3200, a dampening solution or fluid may be provided in a dampening solution source associated with the variable data digital lithographic image forming system, the dampening solution or fluid having a low surface energy that is at least lower than the low surface energy of the reimageable surface, e.g., less than 25. Operation of the method proceeds to Step S3300.

In Step S3300, the dampening solution or fluid may be circulated from the dampening solution source toward the reimageable surface. Operation of the method proceeds to Step S3400.

In Step S3400, the circulating dampening solution or fluid may be exposed to a heat source as the dampening solution or fluid is circulated from the solution source to the reimageable surface. The intent of the exposure of the circulating dampening solution or fluid to the heat source is to vaporize the dampening solution or fluid prior to delivery of the dampening solution or fluid, in a vapor state, to the reimageable surface for condensation thereon. Operation of the method proceeds to Step S3500.

In Step S3500, a uniform layer of the vaporized dampening solution or fluid may be deposited on the reimageable surface. Operation the method proceeds to Step S3600.

In Step S3600, the uniform layer of dampening solution or fluid deposited on the reimageable surface may be exposed to radiation from an imaging source based on received imaging information to form a transferable image on the reimageable surface. Operation of the method proceeds to Step S3700.

In Step S3700, ink may be applied to the transferable image on the reimageable surface to form an inked transferable image. Operation the method proceeds to Step S3800.

In Step S3800, the ink transferable image may be transferred from the reimageable surface to one of an image receiving media substrate and an intermediate transfer component at a high rate (preferably 70+%, and more preferably 90+%) of transfer efficiency. Operation of the method proceeds to Step S3900.

In Step S3900, the reimageable surface may be cleaned to remove residual products from the reimageable surface. These residual products may include, for example, residual ink, previously-deposited dampening solution or fluid, and other residual products. The cleaning of the reimageable surface is intended to prepare the reimageable surface to repeat the above steps. Operation of the method proceeds to Step S4000, where operation of the method ceases.

The above-described exemplary systems and methods may reference certain conventional lithographic image forming device components to provide a brief, background description of image forming means that may be modified to carry out variable data digital lithographic image forming for images using a particularly-configured reimageable surface and a cooperating dampening solution or fluid deposited on the reimageable surface through a vapor deposition/condensation process. No particular limitation to a specific configuration of the variable data digital lithography portions or modules of an overall variable data digital lithographic image forming system is to be construed based on the description of the exemplary elements depicted and described above.

Those skilled in the art will appreciate that other embodiments of the disclosed subject matter may be practiced with many types of image forming elements common to lithographic image forming systems in many different configurations. As mentioned briefly above, experimentation continues to determine the optimum combination of physical properties between the reimageable surface and a cooperating dampening solution or fluid to promote the deposition of a uniform layer of the dampening solution or fluid on the reimageable surface through a vapor deposition and condensation process. The disclosed systems and methods are directed to a broad configuration of dampening solution circulation and vaporization systems and are not intended to imply any potentially limiting configuration based on the above description and the accompanying drawings.

The exemplary depicted sequence of executable method steps represents one example of a corresponding sequence of acts for implementing the functions described in the steps. The exemplary depicted steps may be executed in any reasonable order to carry into effect the objectives of the disclosed embodiments. No particular order to the disclosed steps of the method is necessarily implied by the depiction in FIG. 3, and the accompanying description, except where a particular method step is reasonably considered to be a necessary precondition to execution of any other method step. Individual method steps may be carried out in sequence or in parallel in simultaneous or near simultaneous timing. Additionally, not all of the depicted and described method steps need to be included in any particular scheme according to this disclosure.

It will be appreciated that various of the above-disclosed and other features and functions, or alternatives thereof, may be desirably combined into many other different systems or applications. Various presently unforeseen or unanticipated alternatives, modifications, variations, or improvements therein may be subsequently made by those skilled in the art which are also intended to be encompassed by the following claims.

We claim:

1. A variable data digital lithographic image forming system comprising:
   an imaging member having an arbitrarily reimageable imaging surface, wherein the reimageable surface supporting an ink transfer efficiency in excess of 70 percent and having a first surface-energy, the first surface energy being in a range of less 30 milliNewtons/meter (mN/m);
   a dampening solution (DS) subsystem that provides to the reimageable imaging surface a uniform layer of a dampening solution, the DS subsystem comprising:
      a reservoir with the dampening solution in a liquid state, wherein the dampening solution in the liquid state has a second surface energy, the second surface energy being less than 25 mN/m and the second surface energy being lower than the first surface energy;
      at least one dampening solution movement component to remove the dampening solution in a liquid state from the reservoir;
      wherein the at least one dampening solution movement component is a pump;
      dampening solution vaporization component coupled to the at least one dampening solution movement component to effect the vaporization of the dampening solution and coupled to a dampening solution vapor delivery component;
      wherein the dampening solution vaporization component being one or more of a resistive heating coil, a radiation source, a microwave source, an optical source, a laser, or a conductive heat source;
      wherein vaporization of the dampening solution is heating the dampening solution between 100 C to 300 C;
      wherein the dampening solution vapor delivery component is located facing the reimageable imaging surface;
      wherein the dampening solution vapor delivery component is a manifold configured with a plurality of openings;
      wherein as a result of the second surface energy being lower than the first surface energy the dampening solution in a vapor state condenses as a uniform layer on the reimageable imaging surface;
      wherein the condensed uniform layer is in a range between 0.05 μm and 1.0 μm;
   a patterning subsystem for selectively removing portions of the condensed uniform layer so as to produce an image thereon;
   an inker subsystem for applying ink over the imaging surface such that said ink selectively occupies regions where the condensed uniform layer was removed by the patterning subsystem to thereby form an inked image;
   a transfer subsystem for transferring the inked image to a substrate;
   wherein the reimageable surface supporting an ink transfer efficiency in excess of 90 percent.

2. The system of claim 1, wherein a pipe couples the dampening solution vaporization component to the dampening solution vapor delivery component.

3. The system of claim 1, the first surface energy being less than 25 mN/m.

4. The system of claim 3, the second surface energy being less than 20 mN/m.

5. A variable data digital lithographic image forming system, comprising:

a reimageable surface on an imaging member, the reimageable surface supporting an ink transfer efficiency in excess of 70 percent and having a first surface-energy, the first surface energy being less than 30 mN/m;

a dampening solution subsystem, comprising:

a reservoir with the dampening solution in a liquid state, wherein the dampening solution in the liquid state has a second surface energy, the second surface energy being less than 25 mN/m and the second surface energy being lower than the first surface energy;

at least one dampening solution movement component to remove the dampening solution in a liquid state from the reservoir;

wherein the at least one dampening solution movement component is a pump;

dampening solution vaporization component coupled to the at least one dampening solution movement component to effect the vaporization of the dampening solution and coupled to a dampening solution vapor delivery component;

wherein the dampening solution vaporization component being one or more of a resistive heating coil, a radiation source, a microwave source, an optical source, a laser, or a conductive heat source;

wherein vaporization of the dampening solution is heating the dampening solution between 100 C to 300 C;

wherein the dampening solution vapor delivery component is located facing the reimageable imaging surface;

wherein the dampening solution vapor delivery component is a manifold configured with a plurality of openings;

wherein as a result of the second surface energy being lower than the first surface energy the dampening solution in a vapor state condenses as a uniform layer on the reimageable imaging surface;

wherein the condensed uniform layer is in a range between 0.05 µm and 1.0 µm;

an optical source that patterns the condensed uniform layer of the dampening solution on the reimageable surface according to an image input;

an ink source that inks the patterned uniform layer of the dampening solution on the reimageable surface, the ink being transferred from the reimageable surface to at least one of a substrate and an intermediate transfer member at an imaging nip to form an image on the at least one of the substrate and the intermediate transfer member; and a cleaning unit that cleans residual products from the reimageable surface;

wherein the reimageable surface supporting an ink transfer efficiency of less than 95 percent.

6. The system of claim 5, wherein a pipe couples the dampening solution vaporization component to the dampening solution vapor delivery component.

7. The system of claim 5, the first surface energy being less than 25 mN/m.

8. The system of claim 7, the second surface energy being less than 20 mN/m.

* * * * *